US012805120B2

(12) United States Patent
Wu et al.

(10) Patent No.: US 12,805,120 B2
(45) Date of Patent: Nov. 17, 2026

(54) DISPLAY PANEL AND DISPLAY DEVICE

(71) Applicant: HKC CORPORATION LIMITED, Shenzhen (CN)

(72) Inventors: Kerong Wu, Shenzhen (CN); Rongrong Li, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 965 days.

(21) Appl. No.: 18/090,668

(22) Filed: Dec. 29, 2022

(65) Prior Publication Data

US 2023/0397458 A1 Dec. 7, 2023

(30) Foreign Application Priority Data

Jun. 7, 2022 (CN) ......................... 202210631870.3

(51) Int. Cl.
*H10K 59/122* (2023.01)
*H10K 59/35* (2023.01)

(52) U.S. Cl.
CPC ......... *H10K 59/122* (2023.02); *H10K 59/353* (2023.02)

(58) Field of Classification Search
None
See application file for complete search history.

(56) References Cited

U.S. PATENT DOCUMENTS

2014/0191210 A1 7/2014 Sung
2019/0115403 A1* 4/2019 Kang ................... H10D 86/423
2021/0151711 A1 5/2021 Xu
2021/0408127 A1 12/2021 Zhang
2022/0399411 A1 12/2022 Li et al.
2022/0406860 A1* 12/2022 Lee .................... H10K 59/1315
2022/0407030 A1* 12/2022 Kim ................. H10K 59/80524

FOREIGN PATENT DOCUMENTS

CN 102845130 A 12/2012
CN 103715231 A 4/2014
CN 203631557 U 6/2014
(Continued)

OTHER PUBLICATIONS

First Office Action issued in corresponding CN Application No. CN202210631870.3, mailed Jul. 13, 2022, pp. 1-8, Beijing, China.
(Continued)

*Primary Examiner* — Michelle Mandala
(74) *Attorney, Agent, or Firm* — HAUPTMAN HAM, LLP

(57) ABSTRACT

A display panel is provided in the disclosure. The display panel includes a semiconductor layer, an anode layer, and a light-emitting layer stacked in sequence, where the light-emitting layer includes multiple light-emitting units. A cathode layer is disposed on a surface of the light-emitting layer away from the semiconductor layer. Pixel defining regions are each located between adjacent light-emitting units. The display panel further includes an auxiliary cathode layer disposed at one side of the cathode layer away from the semiconductor layer, the auxiliary cathode layer defines multiple openings and includes multiple connecting parts, each of the multiple openings is opposite to one of the light-emitting units, each of the multiple connecting parts is opposite to one of the pixel defining regions, and the auxiliary cathode layer is electrically connected to the cathode layer through the connecting parts.

20 Claims, 4 Drawing Sheets

(56) References Cited

FOREIGN PATENT DOCUMENTS

| | | | |
|---|---|---|---|
| CN | 103915572 | A | 7/2014 |
| CN | 107887414 | A | 4/2018 |
| CN | 109817694 | A | 5/2019 |
| CN | 109979964 | A | 7/2019 |
| CN | 110010657 | A | 7/2019 |
| CN | 110459580 | A | 11/2019 |
| CN | 110931653 | A | 3/2020 |
| CN | 112003182 | A | 11/2020 |
| CN | 112993182 | A | 6/2021 |
| CN | 113299845 | A | 8/2021 |
| CN | 113437232 | A | 9/2021 |
| CN | 113611812 | A | 11/2021 |
| CN | 113921585 | A | 1/2022 |
| CN | 114188492 | A | 3/2022 |
| EP | 3244467 | B1 | 10/2019 |
| JP | 2007258163 | A | 10/2007 |
| TW | 201203649 | A | 1/2012 |
| TW | 201429016 | A | 7/2014 |

OTHER PUBLICATIONS

Second Office Action issued in corresponding CN Application No. CN202210631870.3, mailed Jul. 29, 2022, pp. 1-10, Beijing, China.
Office action issued in corresponding DE application No. 10 2023 108 942.0 dated Oct. 9, 2023.
Office action issued in corresponding DE application No. 10 2023 108 942.0, dated Jul. 10, 2025. 10 pages (with English translation).

* cited by examiner

DISPLAY PANEL AND DISPLAY DEVICE

CROSS-REFERENCE TO RELATED APPLICATIONS

This application claims priority under 35 U.S.C. § 119(a) to Chinese Patent Application No. 202210631870.3, filed Jun. 7, 2022, the entire disclosure of which is incorporated herein by reference.

TECHNICAL FIELD

This disclosure relates to the field of display technology, and in particular to a display panel and a display device.

BACKGROUND

At present, according to a light-emitting direction, display panels such as Organic Light Emitting Diode (OLED) display panels can generally be classified into bottom-emitting OLED display panels (that is, emitting light downward relative to a semiconductor layer) and top-emitting OLED display panels (that is, emitting light upward relative to the semiconductor layer), where the semiconductor layer includes a substrate and a Thin Film Transistor (TFT) disposed on the substrate.

If an OLED display panel is a top-emitting OLED display panel, the light emitted by the light-emitting layer will be emitted outward through a cathode layer on top of the OLED display panel. Therefore, the cathode layer needs to have a good transmittance and conductivity to meet a display demand and achieve a display effect. However, when a thickness of the cathode layer is reduced to improve the transmittance of the cathode layer, a resistance of the cathode layer will be increased, resulting in a large voltage drop and causing nonuniform display brightness of the display panel.

SUMMARY

In a first aspect, a display panel is provided in the disclosure. The display panel includes a semiconductor layer, an anode layer, and a light-emitting layer stacked in sequence, where the light-emitting layer includes multiple light-emitting units arranged in a matrix and configured to emit light of different colors. The display panel further includes a cathode layer disposed on a surface of the light-emitting layer away from the semiconductor layer, and the cathode layer and the anode layer cooperate to drive the light-emitting units to emit light. The display panel includes pixel defining regions each located between adjacent light-emitting units. The display panel further includes an auxiliary cathode layer disposed at one side of the cathode layer away from the semiconductor layer, the auxiliary cathode layer defines multiple openings and includes multiple connecting parts, each of the multiple openings is opposite to one of the light-emitting units, each of the multiple connecting parts is opposite to one of the pixel defining regions, and the auxiliary cathode layer is electrically connected to the cathode layer through the connecting parts.

In a second aspect, a display device is provided in the disclosure. The display device includes a display panel and a housing, where the display panel is fixed with respect to the housing and has a display surface exposed from the housing and, wherein the display surface is configured for displaying, and the display panel is the display panel above described.

BRIEF DESCRIPTION OF THE DRAWINGS

The drawings herein are incorporated into the description and form a part of the description, showing implementations in accordance with the disclosure, and are used together with the description to explain the principles of the disclosure. In order to explain the technical solution of the implementations of the disclosure more clearly, the following will briefly introduce the drawings needed in the description of the implementations. It is obvious that for those skilled in the art, other drawings can be obtained from these drawings without any creative efforts.

Figure 1:
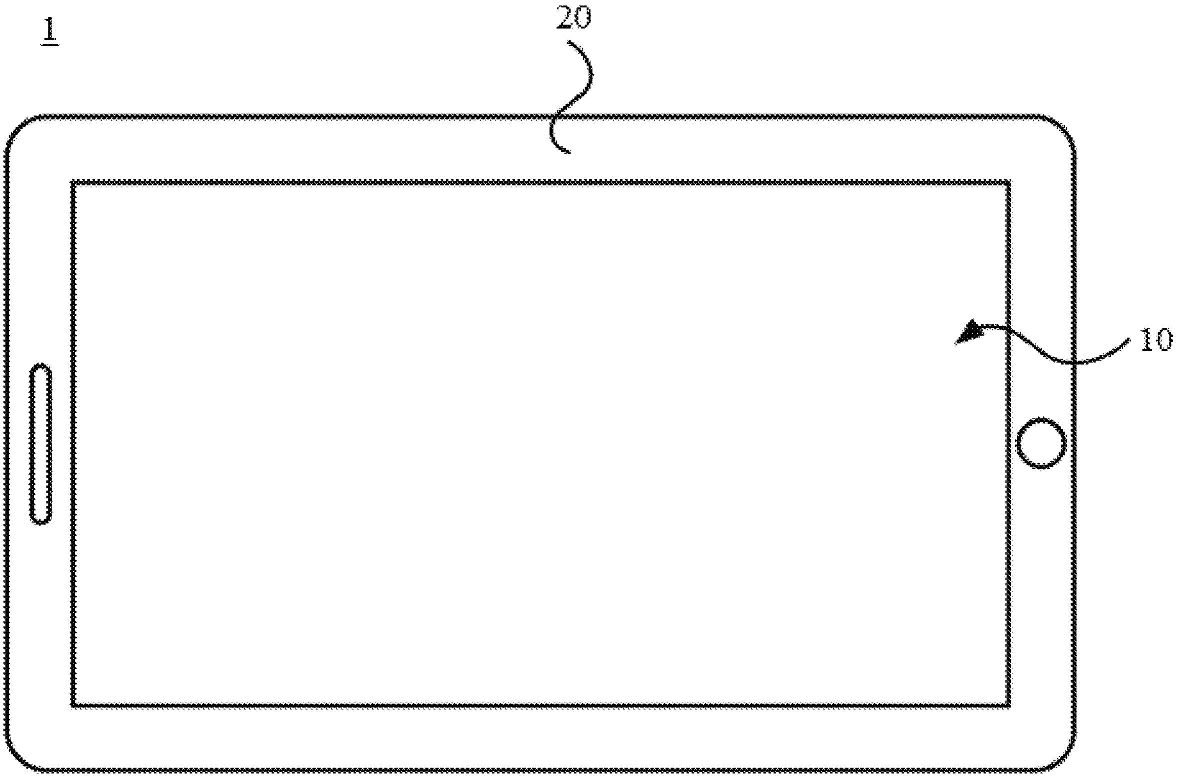
FIG. 1 is a schematic plane structural diagram of a display device in the disclosure.

The realization, functional features and advantages of the disclosure will be further described with reference to the attached drawings in combination with implementations. Through the above drawings, the specific implementations of the disclosure have been shown, and will be described in more detail later. These drawings and descriptions are not intended to limit the scope of the concept of the disclosure, but to explain the concept of the disclosure for those skilled in the art by referring to specific implementations.

DETAILED DESCRIPTION

Exemplary implementations will be described in detail herein, and examples are illustrated in the accompanying drawings. When the following description refers to the drawings, unless otherwise indicated, the same number in different drawings indicates the same or similar elements. The implementations described in the following exemplary implementations do not represent all implementations consistent with the present disclosure. On the contrary, these are only examples of devices and methods consistent with some aspects of the present disclosure as detailed in the appended claims.

It should be noted that, in this disclosure, the terms "including", "comprising" or any other variant thereof are intended to mean non-exclusive inclusion, so that a process, method, article, or device including a series of elements not only includes those elements, but also includes other elements not explicitly listed, or also includes elements inherent to such process, method, article, or device. In case of no further restrictions, the element defined by the sentence "including a . . . " does not exclude that there are other identical elements in the process, method, article, or device including this element. In addition, components, features, and elements with the same name in different implementations of the disclosure may have the same meaning or different meanings. The specific meaning shall be determined according to the interpretation in the specific implementation or further combining with the context in the specific implementation.

It should be understood that although the terms first, second, third, etc. may be used herein to describe various information, such information should not be limited to these terms. These terms are only used to distinguish the same type of information from each other. For example, without departing from the scope of this article, the first information may also be referred to as the second information, and similarly, the second information may also be referred to as the first information. Depending on the context, the word "if" as used here can be interpreted as "when" or "in case of" or "in response to determination that". Furthermore, as used herein, the singular forms "a", "one" and "the" are intended to include the plural, unless the context indicates otherwise. It should be further understood that the terms "including" and "comprising" indicate the existence of the described features, steps, operations, elements, components, items, categories, and/or groups, but do not exclude the existence, presence, or addition of one or more other features, steps, operations, elements, components, items, categories, and/or groups. The terms "or", "and/or", "including at least one of the following", etc. used in this disclosure can be interpreted as inclusive, or mean any one or any combination. For example, "including at least one of the following: A, B, C" means "any of the following: A; B; C; A and B; A and C; B and C; A and B and C", and "A, B or C" or "A, B and/or C" means "any of the following: A; B; C; A and B; A and C; B and C; A and B and C". Exceptions to this definition occur only when combinations of components, functions, steps, or operations are inherently mutually exclusive in some ways.

Exemplary implementations are described herein with reference to sectional views and/or plane view as idealized exemplary drawings. In the drawings, the thickness of layers and regions is enlarged for clarity. Accordingly, it can be assumed that changes in shape relative to the drawings are caused by, for example, manufacturing techniques and/or tolerances. Therefore, the exemplary implementations should not be interpreted as being limited to the shape of the regions illustrated herein, but include shape deviations due to, for example, manufacturing. Therefore, the areas illustrated in the drawings are schematic in nature, and their shapes are not intended to show the actual shape of the area of the device, and are not intended to limit the scope of the exemplary implementations.

In this paper, the expression "A's orthographic projection on C covers B's orthographic projection on C" is used, which means that A's orthographic projection on C coincides with the boundary of B's orthographic projection on C, or that A's orthographic projection on C at least partially does not coincide with the boundary of B's orthographic projection on C, and B's orthographic projection on C is within the range of A's orthographic projection on C.

Referring to FIG. 1, FIG. 1 is a schematic plane structural diagram of a display device 1 in the disclosure.

As illustrated in FIG. 1, the display device 1 of the present disclosure includes a display panel 10 and a housing 20. Specifically, the display panel 10 is fixed relative to the housing 20, that is, the housing 20 is configured to fix and support the display panel 10. The display panel 10 includes a display surface, which is exposed from one side of the housing 20 and is configured for displaying. In this implementation, the display panel 10 is a micro Organic Light-Emitting Diode (OLED) display panel.

Figure 2:
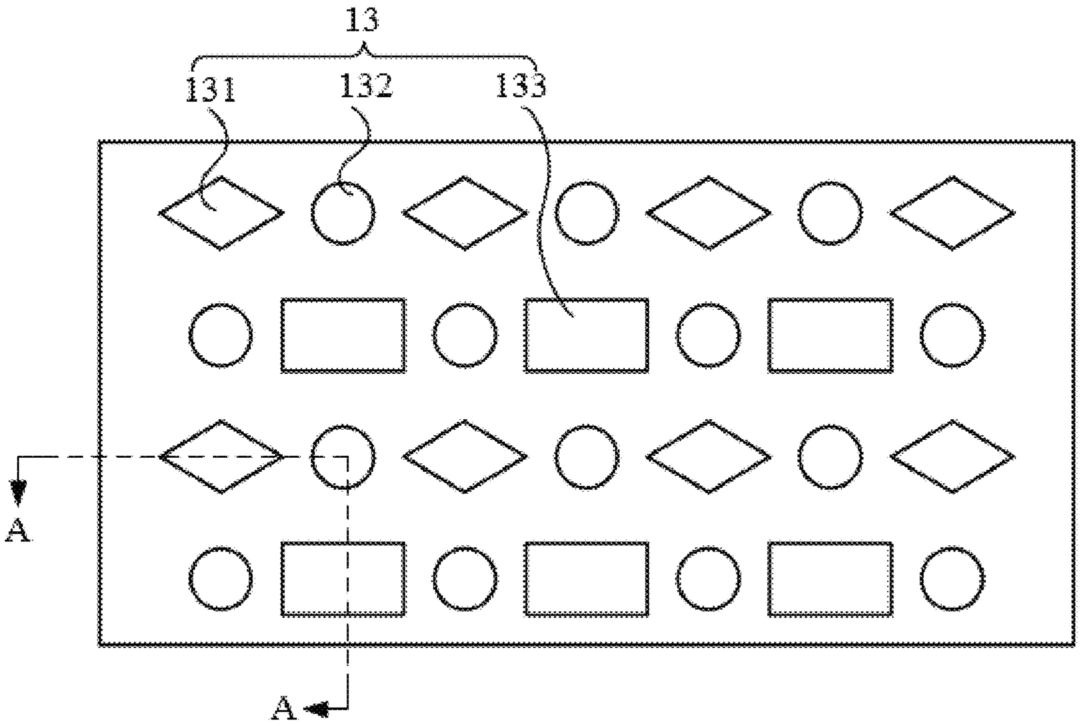
FIG. 2 is a schematic plane structural diagram of a part of the display device illustrated in FIG. 1.
Figure 3:
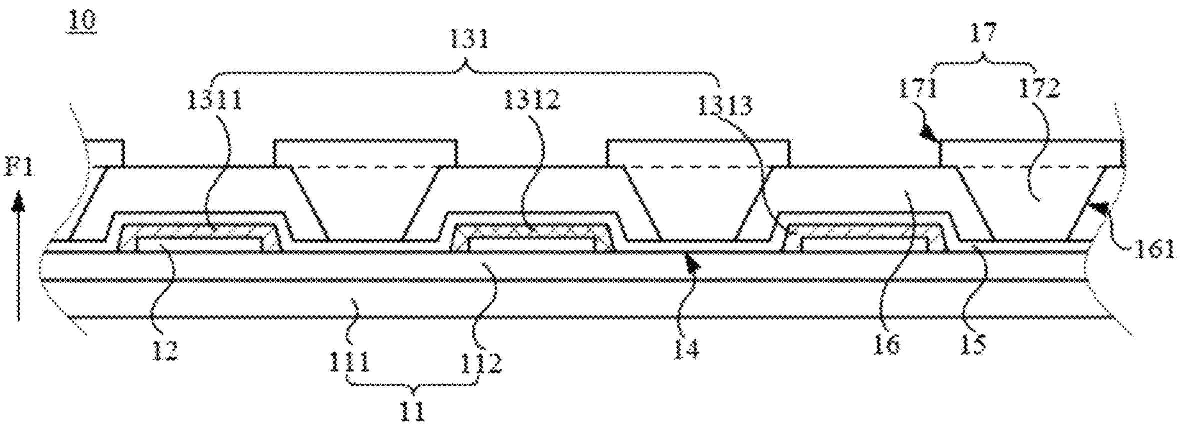
FIG. 3 is a schematic sectional structural diagram of the display panel illustrated in FIG. 2 along A-A in implementations of the disclosure.

Referring to FIG. 2, FIG. 2 is a schematic plane structural diagram of a part of the display panel 10 illustrated in FIG. 1. As illustrated in FIG. 2, the display panel 10 includes multiple light-emitting units 131 arranged in a matrix and configured to emit different lights (FIG. 3). The light-emitting unit 131, as a core light-emitting element, needs to cooperate with other element-structures to form a pixel unit (not shown) that can emit light of different colors. Driven by data signals, multiple light-emitting units 131 cooperate with each other to achieve color image display of the display panel 10.

Specifically, referring to FIG. 2 and FIG. 3, FIG. 3 is a schematic sectional diagram of the display panel illustrated in FIG. 2 along A-A in implementations of the disclosure. As illustrated in FIG. 3, the display panel 10 includes a semiconductor layer 11, an anode layer 12, and a light-emitting layer 13, and the anode layer 12 and the light-emitting layer 13 are sequentially stacked on one surface of the semiconductor layer 11. In implementations of this disclosure, the semiconductor layer 11 may include a substrate 111 and a Thin Film Transistor (TFT) 112. The thin film transistor 112 is disposed on a surface of the substrate 111 facing the cathode layer 15, that is, as illustrated in FIG. 3, the thin film transistor 112 is disposed between the anode layer 12 and the substrate 111.

The substrate 111 is configured to support various structures of the display panel 10, and the thin film transistor 112 is configured to control light emission of the light-emitting layer 13 to achieve different display effects. It should be noted that other structures such as circuits may also be disposed on the substrate 111. In this implementation, only the thin film transistor 112 is shown, but this does not mean that only the thin film transistor 112 is disposed on the substrate 111 in the disclosure. Other functional components may also be configured according to actual needs.

The anode layer 12 is arranged on a surface of the semiconductor layer 11, and the light-emitting layer 13 is covered on one side of the anode layer 12 away from the semiconductor layer 11. The light-emitting layer 13 includes multiple light-emitting units 131. The multiple light-emitting units 131 are configured to emit light of different colors, so that light of different colors can be emitted by the light-emitting units 131 of different colors, and different display effects can be achieved. The color of light emitted by the light-emitting units 131 may be red, green, blue, yellow, or white, etc.

It should be noted that in other implementations of the disclosure, the light emitted by the light-emitting units 131 may also be one color, such as all white. The white light is then converted into light of different colors through a structure or device such as a cover plate with a color filter to achieve the effect of color display. That is, when the light emitted by all the light-emitting units 131 is white, the color display can be realized through the cooperation of the cover plate with the color filter and the display panel 10.

In the implementation illustrated in FIG. 3, the light-emitting units 131 may include a first light-emitting unit 1311, a second light-emitting unit 1312, and a third light-emitting unit 1313. The light emitted by the first light-emitting unit 1311 is blue, the light emitted by the second light-emitting unit 1312 is red, and the light emitted by the third light-emitting unit 1313 is green. In other implementations of the present disclosure, the light-emitting units 131 can also emit light of yellow, white, and other colors. In the implementation illustrated in FIG. 3, only blue, red, green, and other colors are introduced for example.

The multiple light-emitting units 131 are arranged in an array or matrix with respect to the semiconductor layer 11, that is, the multiple light-emitting units 131 are spaced apart from one other. In addition, pixel defining regions 14 are located between any adjacent light-emitting units 131. For example, as illustrated in FIG. 3, for the convenience of explanation, three adjacent light-emitting units 131 are denoted as the first light-emitting unit 1311, the second light-emitting unit 1312, and the third light-emitting unit 1313, where the first light-emitting unit 1311 to the third light-emitting unit 1313 are arranged at preset intervals from one another and configured to emit light of different colors. Specifically, pixel defining regions 14 are arranged between the first light-emitting unit 1311, the second light-emitting unit 1312, and the third light-emitting unit 1313. In this implementation, the pixel defining regions 14 are configured to separate and distinguish each light-emitting unit 1311-1313.

A cathode layer 15 is disposed on a surface of the light-emitting layer 13 away from the semiconductor layer 11. In the implementation illustrated in FIG. 3, the cathode layer 15 covers the surface of the light-emitting layer 13 away from the semiconductor layer 11, and further covers on the pixel defining regions 14. Through the cooperation of the cathode layer 15 and the anode layer 12, the light-emitting units 131 can be driven to emit light of different colors.

Furthermore, the display panel 10 also includes an encapsulation layer 16 and an auxiliary cathode layer 17. As illustrated in FIG. 3, the encapsulation layer 16 covers the surface of the cathode layer 15 away from the semiconductor layer 11, and the auxiliary cathode layer 17 is arranged on a surface of the cathode layer 15 away from the semiconductor layer 11. That is, in the implementation illustrated in FIG. 3, the auxiliary cathode layer 17 covers a surface of the encapsulation layer 16 away from the semiconductor layer 11.

The encapsulation layer 16 may be configured to achieve encapsulation, fixing, and surface-flattening of the display panel 10. For example, by providing the encapsulation layer 16, water vapor, dust and the like can be prevented from invading the elements or structures in the display panel 10. Further, by providing the encapsulation layer 16, a surface of the cathode layer 15 away from the semiconductor layer 11 can form a flattened surface, which can facilitate subsequent process manufacturing.

The auxiliary cathode layer 17 can be made of alloy materials formed by any one or more of Ag, Mo, Al, Cu and Ti, or other conductive materials.

Further, the auxiliary cathode layer 17 includes multiple openings 171 and multiple connecting parts 172. In the implementation illustrated in FIG. 3, each opening 171 corresponds to a light-emitting unit 131, and the size of the opening 171 is the same as that of the corresponding light-emitting unit 131. By providing each opening 171 in the auxiliary cathode layer 17 corresponding to a light-emitting unit 131, the light of the light-emitting unit 131 can exit from the opening 171. That is, the light emitted by the light-emitting unit 131 passes through the cathode layer 15 and exits from the opening 171.

Each connecting part 172 corresponds to a pixel defining region 14, and a projection area of each connecting part 172 on the semiconductor layer 11 along a thickness direction of the display panel 10 is less than a projection area of a pixel defining region 14 corresponding to the connecting part 172 on the semiconductor layer 11 along the thickness direction of the display panel 10, thus avoiding the auxiliary cathode layer 17 from blocking the light emitted by the light-emitting unit 131, and the luminous efficiency will not be affected. As illustrated in FIG. 3, the cross-section shape of the connecting part 172 is an inverted trapezoid. In other implementations of the present disclosure, the cross-section shape of the connecting part 172 may also be rectangular or trapezoid according to actual needs, which is not limited herein.

In this implementation, the light-emitting unit 131 emits light along the direction of the cathode layer 15 with the cooperation of the anode layer 12 and the cathode layer 15, that is, in the implementation, a positive direction near the cathode layer 15 along the thickness direction of the display panel 10 is the light-emitting direction Fl of the light-emitting unit 131.

The encapsulation layer 16 defines multiple through holes 161, which extend along the thickness direction of the display panel 10. Each through hole 161 is opposite to a connecting part 172, where the connecting part 172 penetrates through the through hole 161 and is connected to the cathode layer 15. By defining through holes 161 each extending along the thickness direction of the display panel 10 on the encapsulation layer 16 and corresponding to a connecting part 172, the connecting part 172 can be connected to the cathode layer 15 covering the pixel defining region 14 through the through hole 161. The auxiliary cathode layer 17 can be made on an inner wall of the through-hole 161 by means of coating, exposure development, etching and other processes.

The auxiliary cathode layer 17 is electrically connected with the cathode layer 15 through the connecting parts 172, thereby reducing a resistance of the cathode layer 15 and a voltage drop of the cathode layer 15.

In addition, when the connecting part 172 is connected with the cathode layer 15 covering the pixel defining region 14, the connecting part 172 can separate any two adjacent light-emitting units 131 along the thickness direction of the display panel 10. By separating any two adjacent light-emitting units 131 by the connecting part 172, crosstalk of light of different colors between adjacent light-emitting units 131 can be avoided, thereby improving the display effect of the display panel 10.

When the connecting part 172 separates any two adjacent light-emitting units 131, part of the light emitted by the light-emitting units 131 is emitted on a side surface of the connecting part 172. Since the connecting part 172 is made of a metal conductive material, the light emitted from the light-emitting unit 131 to the connecting part 172 may be reflected, such as reflected back to the light-emitting unit 131, which may affect the display effect of the display panel 10. Therefore, the side surface of the connecting part 172 can be oxidized with ferrous metal to absorb the light emitted by the light-emitting unit 131 to the connecting part 172, so as to reduce the reflection of light and thus improve the display effect of the display panel 10.

Figure 4:
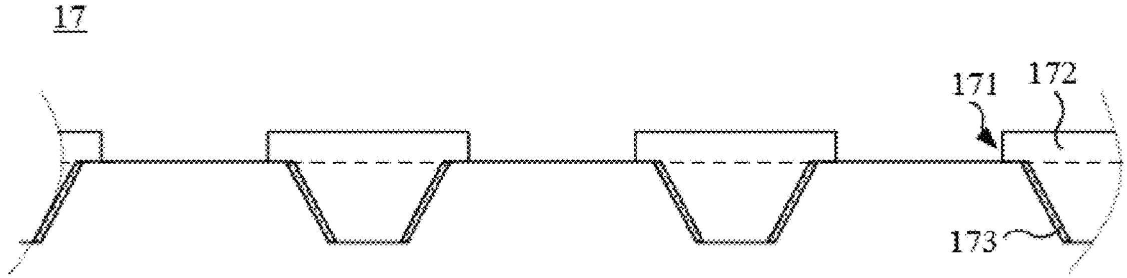
FIG. 4 is a schematic sectional structural diagram of the display panel illustrated in FIG. 2 along A-A in implementations of the disclosure.

Referring to FIG. 4, FIG. 4 is a sectional structural diagram of the display panel in implementations of the disclosure along the A-A direction illustrated in FIG. 2. As illustrated in FIG. 4, the structure of this implementation is basically the same as that of the display panel 10 in FIG. 3, except that a light absorbing layer 173 is disposed on a surface of the connecting part 172 of the auxiliary cathode layer 17. The light absorbing layer 173 is configured to absorb part of the light emitted by the light-emitting unit 131. Specifically, as illustrated in FIG. 4, a light absorbing layer 173 is disposed around the side surface of the connecting part 172 toward the encapsulation layer 16. The light absorbing layer 173 may be made of a material that can absorb light, such as a black adhesive layer.

In this implementation, a light absorbing layer 173 is arranged on the surface of the connecting part 172, which can effectively absorb the light emitted by the light-emitting unit 131 to the surface of the connecting part 172, avoiding the light emitted by the light-emitting unit 131 from reflecting on the surface of the connecting part 172. Therefore, losing of the light energy and display luminance can be avoided, thus improving the display effect of the display panel 10.

In other implementations of the present disclosure, light reflection on the surface of the connecting part 172 may also be reduced by other processes or methods.

Figure 5:
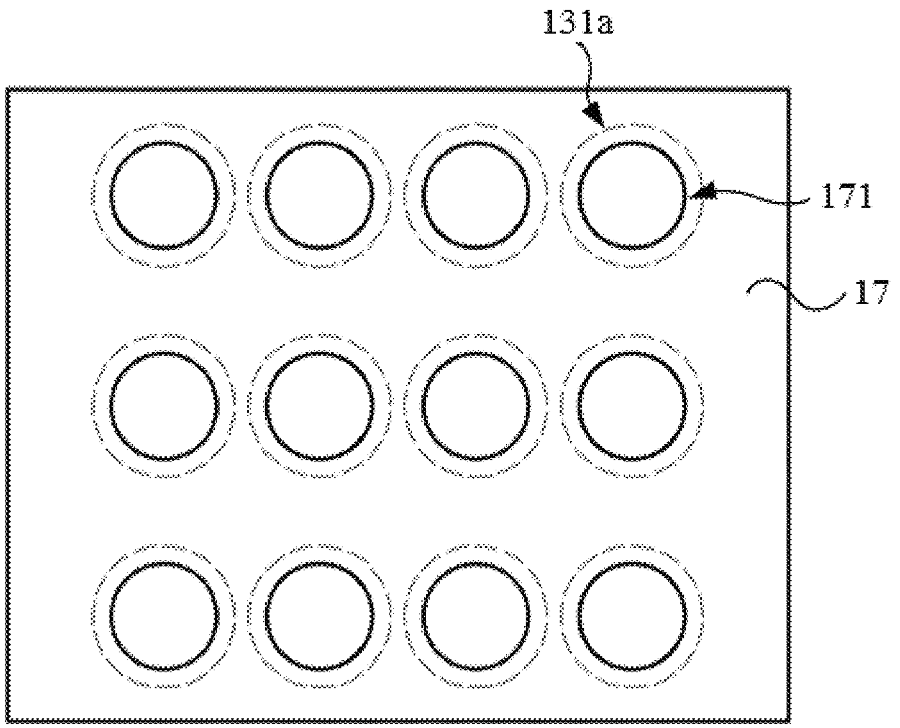
FIG. 5 is a schematic plane structural diagram of a display panel in implementations of the disclosure.

Referring to FIG. 5, FIG. 5 is a schematic plane structural diagram of the display panel 10 in implementations of the disclosure. In this implementation, the structure of the display panel 10 illustrated in FIG. 5 is basically the same as that of the display panel 10 illustrated in FIG. 3, except that the size the opening 171 in the auxiliary cathode layer 17 is different from that in FIG. 3. The projection area of the opening 171 in the auxiliary cathode layer 17 on the semiconductor layer 11 along the thickness direction of the display panel 10 is smaller than the projection area of the light-emitting unit 131 on the semiconductor layer 11.

Specifically, as illustrated in FIG. 5, the light-emitting unit 131 emits light along the thickness direction of the display panel 10, and forms a light-emitting region 131*a* (as illustrated in a dotted circle in FIG. 5). The projected area of the light-emitting unit 131 on the semiconductor layer 11 is a projected area of the light-emitting region 131*a* on the semiconductor layer 11. As illustrated in FIG. 5, the projection area (as illustrated in a solid block in FIG. 5) of the opening 171 in the auxiliary cathode layer 17 on the semiconductor layer 11 along the thickness direction of the display panel 10 is smaller than the projection area of the light-emitting region 131*a* on the semiconductor layer 11.

It should be noted that in FIG. 5, the shapes of the light-emitting region 131*a* and the opening 171 are illustrated as circles as an example, which does not mean that the shapes of the light-emitting region 131*a* and the opening 171 are limited to circles in implementations of the disclosure. In other modified implementations of the disclosure, the shape of the light-emitting region 131*a* and the opening 171 may also be any other shape, such as triangle, rectangle, square, diamond or ellipse, which is not limited herein.

In the implementation illustrated in FIG. 5, the projection area of the opening 171 in the auxiliary cathode layer 17 on the semiconductor layer 11 along the thickness direction of the display panel 10 is smaller than the projection area of the light-emitting unit 131 on the semiconductor layer 11, so that the opening 171 shrinks relative to the light-emitting unit 131, which can improve the display luminance at the front viewing angle of the display panel 10 and reducing the display luminance at the side viewing angle of the display panel 10.

For example, in a possible implementation, by reducing the display luminance at the side viewing angle of the display panel 10, anti-peeping of the display panel 10 at the side viewing angle can be achieved.

Figure 6:
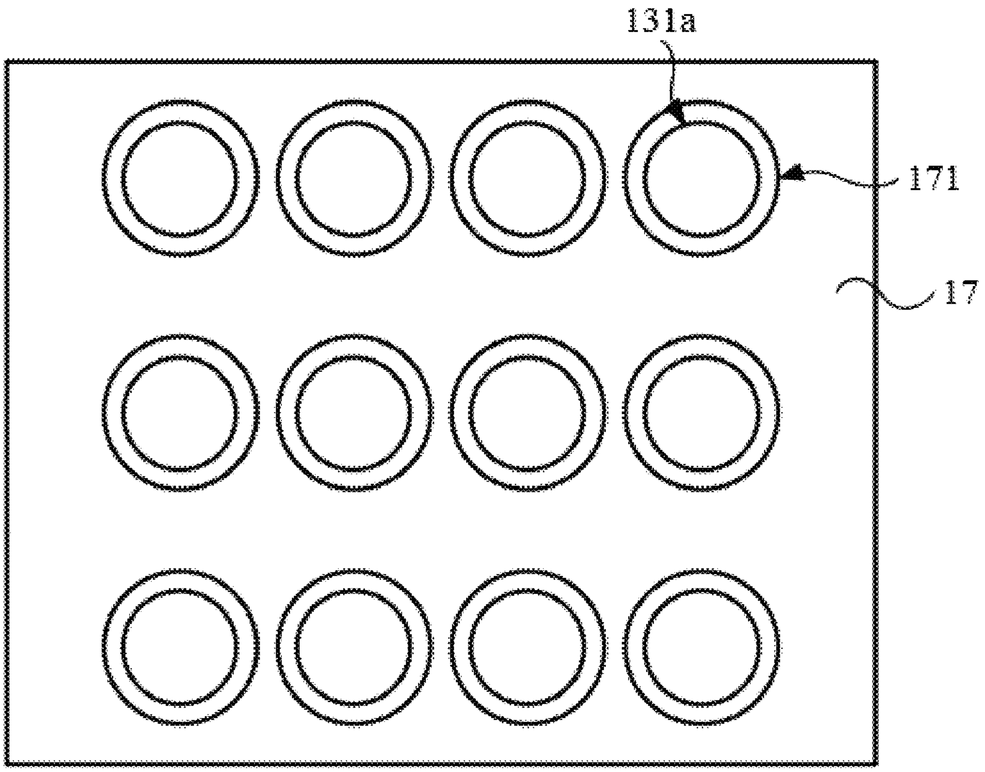
FIG. 6 is a schematic structural diagram of a display panel in implementations of the disclosure.

Referring to FIG. 6, FIG. 6 is a structural diagram of a display panel 10 in implementations of the disclosure. The structure of the display panel 10 of this implementation in FIG. 6 is basically the same as that of the display panel 10 illustrated in FIG. 3, except that the size of the opening 171 in the auxiliary cathode layer 17 is different from that in FIG. 3. As illustrated in FIG. 6, the projection area of the opening 171 in the auxiliary cathode layer 17 on the semiconductor layer 11 along the thickness direction of the display panel 10 is larger than the projection area of the light-emitting unit 131 on the semiconductor layer 11. That is, as illustrated in FIG. 6, the size of the opening 171 in the auxiliary cathode layer 17 is larger than the area of the light-emitting region 131*a*.

The projection area of the opening 171 in the auxiliary cathode layer 17 on the semiconductor layer 11 along the thickness direction of the display panel 10 is larger than the projection area of the light-emitting unit 131 on the semiconductor layer 11, so that the opening 171 expands relative to the light-emitting region 131*a* of the light-emitting unit 131, which can improve the luminous efficiency of the light emitted by the light-emitting unit 131 from the opening 171, so as to improve the side viewing angle of the display panel 10, thus further improving the display effect and increasing a viewing angle of the display panel 10.

Figure 7:
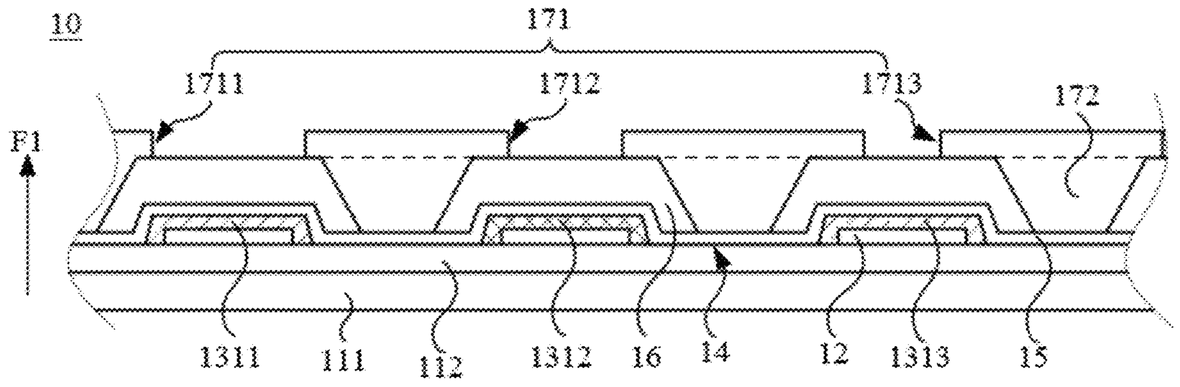
FIG. 7 is a schematic sectional structural diagram of the display panel along A-A in implementations of the disclosure.

Referring to FIG. 7, FIG. 7 is a sectional structural diagram of a display panel 10 along line A-A in implementations of the disclosure. In the implementation illustrated in FIG. 7, the structure of the display panel 10 is basically the same as that of the display panel 10 illustrated in FIG. 3, except that the size of the opening 171 in the auxiliary cathode layer 17 is different from that in FIG. 3. Ratios of display luminance at the side viewing angle and display luminance at the front viewing angle are different for light with different colors, that is, the attenuation of light with different colors at the side viewing angle is inconsistent. Therefore, openings 171 of different sizes are configured for the light-emitting units 131 emitting light of different colors, so as to adjust the display luminance at the side viewing angle of the light-emitting unit 131.

Specifically, as illustrated in FIG. 7, the first light-emitting unit 1311 emits blue light, the second light-emitting unit 1312 emits red light, and the third light-emitting unit 1313 emits green light. As illustrated in FIG. 7, the openings 171 in the auxiliary cathode layer 17 includes a first opening 1711, a second opening 1712, and a third opening 1713. The first opening 1711 corresponds to the first light-emitting unit 1311, the second opening 1712 corresponds to the second light-emitting unit 1312, and the third opening 1713 corresponds to the third light-emitting unit 1313.

Further, a ratio of display luminance at the side viewing angle and display luminance at the front viewing angle for the first light-emitting unit 1311 is a first value, a ratio of display luminance at the side viewing angle and display luminance at the front viewing angle for the second light-emitting unit 1312 is a second value, and a ratio of display luminance at the side viewing angle and display luminance at the front viewing angle for the third light-emitting unit 1313 is a third value. The first value is less than the second value, and the second value is less than the third value. In this case, the sizes of the first opening 1711, the second opening 1712, and the third opening 1713 are successively reduced. As illustrated in FIG. 7, the size of the first opening 1711 is larger than that of the second opening 1712, and the size of the second opening 1712 is larger than that of the third opening 1713.

In this implementation, by providing the light-emitting units 131 corresponding to different colors and openings 171 with different sizes, the attenuation of display luminance at the side viewing angle for the first light-emitting unit 1311, the second light-emitting unit 1312, and the third light-emitting unit 1313 can adjusted, so that the display panel 10 has the same display luminance in the side viewing angle, which can mitigate large-viewing-angle color cast.

Figure 8:
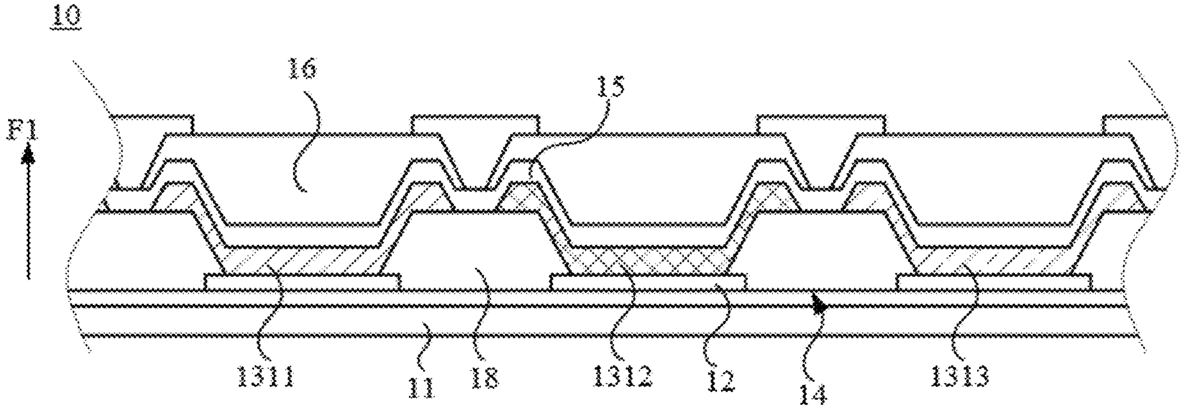
FIG. 8 is a schematic sectional structural diagram of the display panel along A-A in implementations of the disclosure.

Referring to FIG. 8. FIG. 8 is a sectional structural diagram of a display panel 10 along A-A line in implementations of the disclosure. In the implementation illustrated in FIG. 8, the structure of the display panel 10 is basically the same as that of the display panel illustrated in FIG. 3, except that multiple pixel defining parts 18 are disposed between the semiconductor layer 11 and the cathode layer 15. Each pixel defining part 18 corresponds to a pixel defining region 14, and is located between the semiconductor layer 11 and the cathode layer 15 to separate two adjacent light-emitting units 131 along the thickness direction of the display panel 10.

Specifically, as illustrated in FIG. 8, each pixel defining region 14 is provided with a pixel defining part 18, so that any two adjacent light-emitting units 131 can be separated along the thickness direction of the display panel 10 by the pixel defining parts 18. The cathode layer 15 covers both the light-emitting layer 13 and the pixel defining parts 18. The connecting part 172 of the auxiliary cathode layer 17 extends towards the pixel defining part 18 along the thickness direction of the display panel 10, and is electrically connected with the cathode layer 15 covered in the pixel defining part 18. As such, the electrical connection between the auxiliary cathode layer 17 and the cathode layer 15 can be achieved, and the auxiliary cathode layer 17 can be prevented from blocking the light emitted from the light-emitting layer 13.

The material of the pixel defining part 18 may be a black photoresist or other material for absorbing light.

It should be noted that a cross-section shape of the pixel defining part 18 can be rectangular, trapezoidal, or square, and FIG. 8 only illustrates a trapezoidal section shape of the pixel defining part 18 along the A-A line as an example.

In this implementation, the pixel defining part 18 is disposed between the semiconductor layer 11 and the cathode layer 15 and corresponding the pixel defining region 14, which can separate any two adjacent light-emitting units 131 in the thickness direction of the display panel 10, thus avoiding light crosstalk between adjacent light-emitting units 131 and thus improving the display effect of the display panel 10.

In some implementations, the resistivity of the auxiliary cathode layer 17 is less than that of the cathode layer 15.

In this implementation, the resistivity of the auxiliary cathode layer 17 is less than that of the cathode layer 15, so that the resistance of the cathode layer 15 can be further reduced.

In some implementations, the thickness of the auxiliary cathode layer 17 is greater than that of the cathode layer 15.

In this implementation, the thickness of the auxiliary cathode layer 17 is greater than that of the cathode layer 15, so that the resistance of the cathode layer 15 can be further reduced, and the voltage drop of the cathode layer 15 can be reduced, thereby improving the brightness uniformity and display effect of the display panel 10.

Furthermore, since the display panel 10 in any of the above implementations is used, the display device 1 in the disclosure has all the technical effects that the display panel 10 in any of the above implementations may have.

Figure 9:
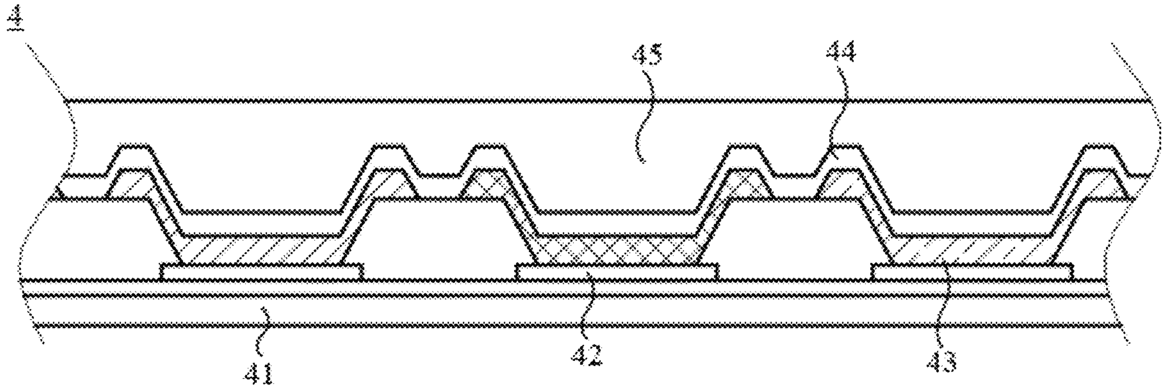
FIG. 9 is a schematic sectional diagram of the display panel along A-A in a comparison example of the disclosure.

Referring to FIG. 9, FIG. 9 is a schematic diagram of a sectional structure of an existing display panel 4 along line A-A in a comparison example of the disclosure. As illustrated in FIG. 9, when the existing display panel 4 emits light in a manner of top emission, the anode layer 42, the light-emitting layer 43, the cathode layer 44, and the encapsulation layer 45 are usually sequentially laminated on the semiconductor layer 41. The cathode layer 44 and the anode layer 42 cooperate to drive the light-emitting layer 43 to emit light of different colors for display.

In order to maintain a high transmittance of the existing display panel 4, the cathode layer 44 is usually made of transparent metal or metal alloy materials, or the thickness of the cathode layer 44 is reduced. However, reducing the thickness of the cathode layer 44 will result in a large resistance, which will cause a large voltage drop in the cathode layer 44. For example, when the existing display panel 4 is a large size display, the farther the cathode layer 44 is from a voltage input terminal of the existing display panel 4, the more obvious the voltage drop is, which will lead to uneven display brightness of the existing display panel 4 and affect the perception experience of the user.

Compared with the structure of the existing display panel 4 illustrated in FIG. 9, in the structure of the display panel 10 illustrated in FIG. 3 to FIG. 8 in the present disclosure, each opening 171 in the auxiliary cathode layer 17 is opposite to a light-emitting unit 131, the light of the light-emitting unit 131 can be exited outward from the opening 171, thus preventing the auxiliary cathode layer 17 from blocking the light emitted by the light-emitting unit 131, and the luminous efficiency will not be affected. The connecting parts 172 are electrically connecting to the cathode layer 15, so that the resistance of the cathode layer 15 can be reduced, thereby reducing the voltage drop of the cathode layer 15. In addition, each connecting part 172 is disposed corresponding to a pixel defining region 14, which can prevent the connecting part 172 from blocking the light of the light-emitting unit 131.

Furthermore, in the display panel 110, by providing an auxiliary cathode layer 17 on the side of the cathode layer 15 away from the semiconductor layer 11, the resistance of the cathode layer 15 can be reduced, thereby reducing the voltage drop of the cathode layer 15 and improving the display brightness uniformity and display effect of the display panel 10.

The disclosure provides a display panel to improve display brightness uniformity and display effect by reducing a resistance of a cathode layer, and provides a display device with the display panel.

A display panel is provided in the disclosure. The display panel includes a semiconductor layer, an anode layer, and a light-emitting layer stacked in sequence, where the light-emitting layer includes multiple light-emitting units arranged in a matrix and configured to emit light of different colors. A cathode layer is disposed on a surface of the light-emitting layer away from the semiconductor layer, and the cathode layer and the anode layer cooperate to drive the light-emitting units to emit light. Pixel defining regions are each located between adjacent light-emitting units. The display panel further includes an auxiliary cathode layer disposed at one side of the cathode layer away from the semiconductor layer, the auxiliary cathode layer defines multiple openings and includes multiple connecting parts, each of the multiple openings is opposite to one of the light-emitting units, each of the multiple connecting parts is opposite to one of the pixel defining regions, and the auxiliary cathode layer is electrically connected to the cathode layer through the connecting parts.

In this implementation, each opening in the auxiliary cathode layer is arranged to be opposite to one light-emitting unit, so that the light emitted by the light-emitting units can be emitted outward from the openings, thus avoiding the auxiliary cathode layer from blocking the light emitted by the light-emitting unit, and the luminous efficiency will not be affected. The connecting parts are electrically connecting to the cathode layer, so that the resistance of the cathode layer can be reduced and thus the voltage drop of the cathode layer can be reduced. In addition, each connecting part is arranged to be opposite to one pixel defining region, so that the connecting parts will not block the light from the light-emitting units. Furthermore, in the display panel in this disclosure, the auxiliary cathode layer is disposed at the side of the cathode layer away from the semiconductor layer, the resistance of the cathode layer can be reduced, thereby reducing the voltage drop of the cathode layer and improving the display brightness uniformity and display effect of the display panel.

In an implementation, the display panel further includes an encapsulation layer, where the encapsulation layer covers a surface of the cathode layer away from the light-emitting layer and defines multiple through holes extending along a thickness direction of the display panel, where each of the through holes is opposite to one of the connecting parts, and the connecting part penetrates the through hole and connects with the cathode layer.

In this implementation, by providing the encapsulation layer, encapsulation of the display panel can be achieved. By providing through holes on the encapsulation layer that are extending along the thickness direction of the display panel and each are opposite to one connecting part, the connecting parts can be connected with the cathode layer through the through holes.

In an implementation, the cathode layer covers the light-emitting units and the pixel defining regions, and when the connecting part opposite to the pixel defining region is connected with the cathode layer, the connecting part separates any two adjacent light-emitting units along a light exiting direction of the display panel.

In this implementation, the connecting parts are arranged to connect with the cathode layer covering the pixel defining region, so that the connecting parts can separate any two adjacent light-emitting units along the thickness direction of the display panel, thus avoiding light crosstalk between adjacent light-emitting units and improving the display effect of the display panel in the disclosure.

In an implementation, a light absorbing layer is disposed on surfaces of the connecting parts and is configured to absorb part of light emitted from the light-emitting units.

In this implementation, the light absorbing layer is disposed on the surfaces of the connecting parts, so that the light absorbing layer can absorb the light emitted from the light-emitting units to the surfaces of the connecting parts, so as to avoid the reflection of the light emitted from the light-emitting layer on the surfaces of the connecting parts, thereby improving the display effect of the display panel in the disclosure.

In an implementation, a projection area of the opening on the semiconductor layer along a thickness direction of the display panel is smaller than a projection area of the light-emitting unit on the semiconductor layer along the thickness direction of the display panel.

In this implementation, the projection area of the opening in the auxiliary cathode layer on the semiconductor layer along the thickness direction of the display panel is smaller than the projection area of the light-emitting unit on the semiconductor layer. Therefore, the opening shrinks relative to the light-emitting unit, thereby improving display luminance at a front viewing angle and reducing display luminance at a side viewing angle.

In an implementation, the projection area of the opening on the semiconductor layer along the thickness direction of the display panel is larger than the projection area of the light-emitting unit on the semiconductor layer along the thickness direction of the display panel.

In this implementation, the projection area of the opening in the auxiliary cathode layer on the semiconductor layer along the thickness direction of the display panel is larger than the projection area of the light-emitting unit on the semiconductor layer. Therefore, the opening expands outwards relative to the light-emitting unit, thereby improving the efficiency of emitting light by the light-emitting unit outwards from the opening, and increasing the side viewing angle of the display panel in the present disclosure.

In an implementation, the light-emitting units include a first light-emitting unit, a second light-emitting unit, and a third light-emitting unit, the auxiliary cathode layer defines a first opening opposite to the first light-emitting unit, a second opening opposite to the second light-emitting unit, and a third opening opposite to the third light-emitting unit, and sizes of the first opening, the second opening and the third opening are different from one another.

In this implementation, by providing the light-emitting units corresponding to different colors and providing the openings of different sizes, the attenuation of the display luminance at the side viewing angle can be adjusted for the first light-emitting unit, the second light-emitting unit, and the third light-emitting unit, so that the display panel in the disclosure can have the same display luminance at the side viewing angle, thus mitigating large-viewing-angle color cast.

In an implementation, the display panel further includes multiple pixel defining parts, where the multiple pixel defining parts correspond to the pixel defining regions and are arranged between the semiconductor layer and the cathode layer, to separate any two adjacent light-emitting units along the light exiting direction of the display panel.

In this implementation, by providing the pixel defining parts between the semiconductor layer and the cathode layer and opposite to the pixel defining regions, any two adjacent light-emitting units can be separated in the thickness direction of the display panel, which can avoid light crosstalk between adjacent light-emitting units and thus improve the display effect of the display panel in the disclosure.

In an implementation, the auxiliary cathode layer has a resistivity less than the cathode layer.

In this implementation, the auxiliary cathode layer has a resistivity less than the cathode layer, so that the resistance of the cathode layer can be further reduced.

In an implementation, the auxiliary cathode layer has a thickness larger than the cathode layer.

In this implementation, the auxiliary cathode layer has a thickness larger than the cathode layer, so that the resistance of the cathode layer can be further reduced, and the voltage drop of the cathode layer can be further reduced, thus improving the display brightness uniformity and display effect of the display panel.

A display device is further provided in the disclosure. The display device includes a display panel and a housing, where the display panel is fixed with respect to the housing and has a display surface exposed from the housing and, wherein the display surface is configured for displaying, and the display panel is the display panel above described.

By providing the display device with the display panel in any of the above implementations, the display device has the beneficial effects of the display panel in any of the above implementations.

It can be understood that the above scenarios are only examples and do not constitute a limitation on the scenario of the technical solution provided by the implementations of the disclosure. The technical solution of the disclosure can also be applied to other scenarios. For example, those skilled in the art can know that the technical solutions provided in the implementations of the disclosure are also applicable to similar technical problems.

The serial number of the implementations of the disclosure is only for description and does not represent the advantages and disadvantages of the implementations.

The implementations of the disclosure may be merged, separated, and deleted according to actual needs.

In this disclosure, the same or similar terms, concepts, technical solutions and/or disclosure scenarios are generally described in detail only when occurring for the first time. When occurring again later, these terms, concepts, technical solutions and/or disclosure scenarios will generally not be repeated for the sake of brevity. In terms of understanding the technical solutions and other contents of this disclosure, the same or similar terms, concepts, technical solutions and/or disclosure scenarios that are not described in detail later may be referred to the previous detailed description.

In this disclosure, the description of each implementation has its own emphasis. For the part not detailed or recorded in one implementation, reference may be made to the relevant description of other implementations.

The technical features of the technical solution of the disclosure can be combined arbitrarily. To make the description concise, all possible combinations of the technical features in the above implementations are not described. However, the combination of these technical features should be considered as within the scope of the disclosure in case of no conflict.

Through the above description of the implementations, those skilled in the art can clearly understand that the above implementations may be changed, but in many cases, the former are better implementations. Based on such understanding, the technical solution of the present disclosure is in essence or is correct.

The above is only preferred implementations of the disclosure, and does not limit the scope of the disclosure. Any equivalent structure or equivalent process transformation made by using the description of the disclosure and the drawings, or directly or indirectly applied in other related technical fields, are similarly included in the scope of protection of the disclosure.

What is claimed is:

1. A display panel, comprising:

a semiconductor layer;

an anode layer;

a light-emitting layer comprising a plurality of light-emitting units arranged in a matrix and configured to emit light of different colors, wherein the semiconductor layer, the anode layer, and the light-emitting layer are stacked in sequence;

pixel defining regions each located between adjacent light-emitting units;

a cathode layer disposed on a surface of the light-emitting layer away from the semiconductor layer, wherein the cathode layer and the anode layer cooperate to drive the light-emitting units to emit light, and the cathode layer covers the light-emitting layer and contacts a surface of the semiconductor layer corresponding to the pixel defining regions; and an auxiliary cathode layer disposed at one side of the cathode layer away from the semiconductor layer, wherein the auxiliary cathode layer defines a plurality of openings and comprises a plurality of connecting parts, each of the plurality of openings is opposite to one of the light-emitting units, each of the plurality of connecting parts is opposite to one of the pixel defining regions, and the auxiliary cathode layer is electrically connected to the cathode layer through the connecting parts, wherein, along a thickness direction of the display panel, a projection area of an opening of the plurality of openings onto the semiconductor layer at least partially overlaps a projection area of the light-emitting unit opposite to the opening onto the semiconductor layer.

2. The display panel of claim 1, further comprising an encapsulation layer, wherein the encapsulation layer covers a surface of the cathode layer away from the light-emitting layer and defines a plurality of through holes extending along a thickness direction of the display panel, wherein each of the through holes is opposite to one of the connecting parts, and the connecting part penetrates the through hole and connects with the cathode layer.

3. The display panel of claim 2, wherein-when the connecting part opposite to the pixel defining region is connected with the cathode layer, the connecting part separates any two adjacent light-emitting units along a light exiting direction of the display panel.

4. The display panel of claim 2, further comprising a plurality of pixel defining parts, wherein the plurality of pixel defining parts correspond to the pixel defining regions and are arranged between the semiconductor layer and the cathode layer, to separate any two adjacent light-emitting units along the light exiting direction of the display panel.

5. The display panel of claim 1, further comprising a light absorbing layer disposed on surfaces of the connecting parts and configured to absorb part of light emitted from the light-emitting units.

6. The display panel of claim 5, wherein, along the thickness direction of the display panel, the projection area of the opening onto the semiconductor layer is larger than the projection area of the light-emitting unit onto the semiconductor layer.

7. The display panel of claim 6, wherein the light-emitting units comprise a first light-emitting unit, a second light-emitting unit, and a third light-emitting unit, the auxiliary cathode layer defines a first opening opposite to the first light-emitting unit, a second opening opposite to the second light-emitting unit, and a third opening opposite to the third light-emitting unit, and sizes of the first opening, the second opening, and the third opening are different from one another.

8. The display panel of claim 6, wherein the auxiliary cathode layer has a resistivity less than the cathode layer.

9. The display panel of claim 6, wherein the auxiliary cathode layer has a thickness larger than the cathode layer.

10. A display device, comprising a display panel and a housing, wherein the display panel is fixed with respect to the housing and has a display surface exposed from the housing, wherein the display surface is configured for displaying, and the display panel comprises:

a semiconductor layer;

an anode layer;

a light-emitting layer comprising a plurality of light-emitting units arranged in a matrix and configured to emit light of different colors, wherein the semiconductor layer, the anode layer, and the light-emitting layer are stacked in sequence;

pixel defining regions each located between adjacent light-emitting units;

a cathode layer disposed on a surface of the light-emitting layer away from the semiconductor layer, wherein the cathode layer and the anode layer cooperate to drive the light-emitting units to emit light, and the cathode layer covers the light-emitting layer and contacts a surface of the semiconductor layer corresponding to the pixel defining regions; and an auxiliary cathode layer disposed at one side of the cathode layer away from the semiconductor layer, wherein the auxiliary cathode layer defines a plurality of openings and comprises a plurality of connecting parts, each of the plurality of openings is opposite to one of the light-emitting units, each of the plurality of connecting parts is opposite to one of the pixel defining regions, and the auxiliary cathode layer is electrically connected to the cathode layer through the connecting parts, wherein, along a thickness direction of the display panel, a projection area of an opening of the plurality of openings onto the semiconductor layer at least partially overlaps a projection area of the light-emitting unit opposite to the opening onto the semiconductor layer.

11. The display device of claim 10, wherein the display panel further comprises an encapsulation layer, wherein the encapsulation layer covers a surface of the cathode layer away from the light-emitting layer and defines a plurality of through holes extending along a thickness direction of the display panel, wherein each of the through holes is opposite to one of the connecting parts, and the connecting part penetrates the through hole and connects with the cathode layer.

12. The display device of claim 11, wherein when the connecting part opposite to the pixel defining region is connected with the cathode layer, the connecting part separates any two adjacent light-emitting units along a light exiting direction of the display panel.

13. The display device of claim 11, wherein the display panel further comprises a plurality of pixel defining parts, wherein the plurality of pixel defining parts correspond to the pixel defining regions and are arranged between the semiconductor layer and the cathode layer, to separate any two adjacent light-emitting units along the light exiting direction of the display panel.

14. The display device of claim 10, wherein the display panel further comprises a light absorbing layer disposed on surfaces of the connecting parts and configured to absorb part of light emitted from the light-emitting units.

15. The display device of claim 14, wherein, along the thickness direction of the display panel, the projection area of the opening onto the semiconductor layer is larger than the projection area of the light-emitting unit onto the semiconductor layer.

16. The display device of claim 15, wherein the light-emitting units comprise a first light-emitting unit, a second light-emitting unit, and a third light-emitting unit, the auxiliary cathode layer defines a first opening opposite to the first light-emitting unit, a second opening opposite to the second light-emitting unit, and a third opening opposite to the third light-emitting unit, and sizes of the first opening, the second opening, and the third opening are different from one another.

17. The display device of claim 15, wherein the auxiliary cathode layer has a resistivity less than the cathode layer.

18. The display device of claim 15, wherein the auxiliary cathode layer has a thickness larger than the cathode layer.

19. The display panel of claim 1, wherein a cross-section shape of the connecting part is an inverted trapezoid.

20. The display panel of claim 1, wherein a side surface of the connecting part is oxidized with ferrous metal to enable the connecting part to absorb the light emitted by the light-emitting unit emitted in a direction away from the anode layer.

* * * * *